(12) United States Patent
 Lesonen

(10) Patent No.: US 11,762,510 B2
(45) Date of Patent: Sep. 19, 2023

(54) DISPLAY ARRANGEMENT AND METHOD

(71) Applicant: BENEQ OY

(72) Inventor: Janne Lesonen, Espoo (FI)

(73) Assignee: BENEQ OY, Espoo (FI)

( * ) Notice: Subject to any disclaimer, the term of this patent is extended or adjusted under 35 U.S.C. 154(b) by 0 days.

(21) Appl. No.: 17/600,511

(22) PCT Filed: Apr. 3, 2020

(86) PCT No.: PCT/FI2020/050218
§ 371 (c)(1),
(2) Date: Sep. 30, 2021

(87) PCT Pub. No.: WO2020/201635
PCT Pub. Date: Oct. 8, 2020

(65) Prior Publication Data
US 2022/0206603 A1 Jun. 30, 2022

(30) Foreign Application Priority Data

Apr. 5, 2019 (FI) ...................................... 20195279

(51) Int. Cl.
*G06F 3/044* (2006.01)
*G06F 3/041* (2006.01)
*H10K 59/40* (2023.01)

(52) U.S. Cl.
CPC ............ *G06F 3/044* (2013.01); *G06F 3/0418* (2013.01); *H10K 59/40* (2023.02); *G06F 2203/04107* (2013.01)

(58) Field of Classification Search
CPC ...... G06F 3/0412; G06F 3/0418; G06F 3/044; G06F 2203/04107; H01L 27/323
See application file for complete search history.

(56) References Cited

U.S. PATENT DOCUMENTS

| 2017/0277295 A1 | 9/2017 | Reynolds et al. |
| 2017/0371464 A1 | 12/2017 | Nakanishi |
| 2018/0136777 A1 | 5/2018 | Omata et al. |

*Primary Examiner* — Michael Pervan
(74) *Attorney, Agent, or Firm* — Kilpatrick Townsend & Stockton LLP

(57) ABSTRACT

A display arrangement comprises a thin film display element comprising a first patterned conductor layer, comprising a first display electrode, on a first side of an emissive layer; a second patterned conductor layer, comprising a second display electrode, on a second side of the emissive layer opposite the first side; and a touch-sensing element comprising first and second touch electrodes formed in the first and second patterned conductor layers, respectively. The display arrangement further comprises a control unit configured to measure capacitive coupling for at least one of the touch electrodes, said measuring comprising supplying a measurement volt age signal to the touch-sensing element, and, when supplying the measurement voltage signal to one touch electrode, to supply a shielding voltage signal to the other touch electrode to decrease an effect of a touch from the side of said other touch electrode on the capacitive coupling for said one touch electrode.

17 Claims, 4 Drawing Sheets

DISPLAY ARRANGEMENT AND METHOD

CROSS-REFERENCE TO RELATED APPLICATIONS

This application is a U.S. National Phase of International Application No. PCT/FI2020/050218, filed Apr. 3, 2020, which claims the benefit of Finnish Application No. 20195279, filed Apr. 5, 2019, the entire contents and disclosures of which are incorporated herein by reference.

BACKGROUND

A display device comprising a transparent display element, such as an inorganic thin film electroluminescent (TFEL) display element or a thin film organic light emitting diode (OLED) display element, may be provided with various types of input devices for controlling an information processing system connected with the display device.

For example, an electrical display device may comprise a touch-sensitive input device laminated onto a display element. However, addition of a touch-sensitive input device or element onto a display element increases the complexity of the structure and manufacturing of the latter, and may also impair the optical properties of the display element.

From a functional point of view, a transparent display element may be configured to operate two-directionally, thus to display information to both sides thereof. In such case, feasibility of touch-based interactivity of the display element may strongly depend on the detailed configuration and way of operation of the touch-sensitive device, element, or arrangement. In light of this, it may be desirable to develop new solutions related to displays and touch-sensitive input devices thereof.

SUMMARY

This summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to a first aspect, a display arrangement is provided. The display arrangement comprises a transparent thin film display element with a layer structure extending substantially along a base plane defining a lateral extension of the display element.

The thin film display element comprises an emissive layer configured to emit light in consequence of electrical voltage coupled over the emissive layer; a first patterned conductor layer, on a first side of the emissive layer, comprising a first display electrode; a second patterned conductor layer, on a second side of the emissive layer opposite the first side, comprising a second display electrode at least partly laterally overlapping the first display electrode; and a touch-sensing element comprising a first touch electrode and a second touch electrode formed in the first and second patterned conductor layers, respectively.

The display arrangement further comprises a control unit configured to measure touch-dependent capacitive coupling for at least one of the first and second touch electrodes, said measuring comprising supplying a time-dependent measurement voltage signal to the touch-sensing element, and, when supplying the measurement voltage signal to the touch-sensing element for measuring the touch-dependent capacitive coupling for one of the first and second touch electrodes, to supply a shielding voltage signal to the other touch electrode to decrease an effect of a touch from the side of said other touch electrode on the touch-dependent capacitive coupling for said one touch electrode.

According to a second aspect, a method for touch detection using a thin film display element is provided, wherein the thin film display element is in accordance with the first aspect or any embodiment thereof disclosed in this specification.

The method comprises measuring touch-dependent capacitive coupling for at least one of the first and the second touch electrodes, said measuring comprising supplying a time-dependent measurement voltage signal to the touch-sensing element, and, when supplying the measurement voltage signal to the touch-sensing element for measuring the touch-dependent capacitive coupling for one of the first and the second touch electrodes, supplying a shielding voltage signal to the other touch electrode to decrease an effect of a touch from the side of said other touch electrode on the touch-dependent capacitive coupling for said one touch electrode.

It is specifically to be understood that a control unit in accordance with the first aspect may be configured to control a thin film display element using a method in accordance with the second aspect or any embodiment thereof disclosed in this specification.

BRIEF DESCRIPTION OF DRAWINGS

The present disclosure will be better understood from the following detailed description read in light of the accompanying drawings, wherein.

Unless specifically stated to the contrary, any drawing of the aforementioned drawings may be not drawn to scale such that any element in said drawing may be drawn with inaccurate proportions with respect to other elements in said drawing in order to emphasize certain structural aspects of the embodiment of said drawing.

Moreover, corresponding elements in the embodiments of any two drawings of the aforementioned drawings may be disproportionate to each other in said two drawings in order to emphasize certain structural aspects of the embodiments of said two drawings.

DETAILED DESCRIPTION

Concerning display arrangements and methods discussed in this detailed description, the following shall be noted.

Herein, a "display", or a "display panel", may refer to a device, e.g., electronic device, configured to present data or imagery. The aforementioned terms may be understood broadly in the context of this specification, naturally covering displays capable of displaying various patterns, images, or text, but also, for example, various control panels and user interface elements with at least one emissive area for emitting light therefrom.

Further, a "display arrangement" may refer to an arrangement which may form, as such, a complete, operable display. Alternatively, a display arrangement may be used as a part of a complete display comprising also other elements, units, and/or structures. A display arrangement may generally comprise at least one display element.

Throughout this specification, a "display element" may refer to an element comprising at least one emissive area for emitting light therefrom in order to present visual information.

Herein, "light" may refer to electromagnetic radiation of any wavelength(s) within a range of relevant wavelengths. The range of relevant wavelengths may overlap or coincide with ultraviolet (wavelength from about 10 nanometers (nm) to about 400 nm), visible (wavelength from about 400 nm to about 700 nm), and/or infrared (wavelength from about 700 nm to about 1 millimeter (mm)) parts of electromagnetic spectrum.

Figure 1:
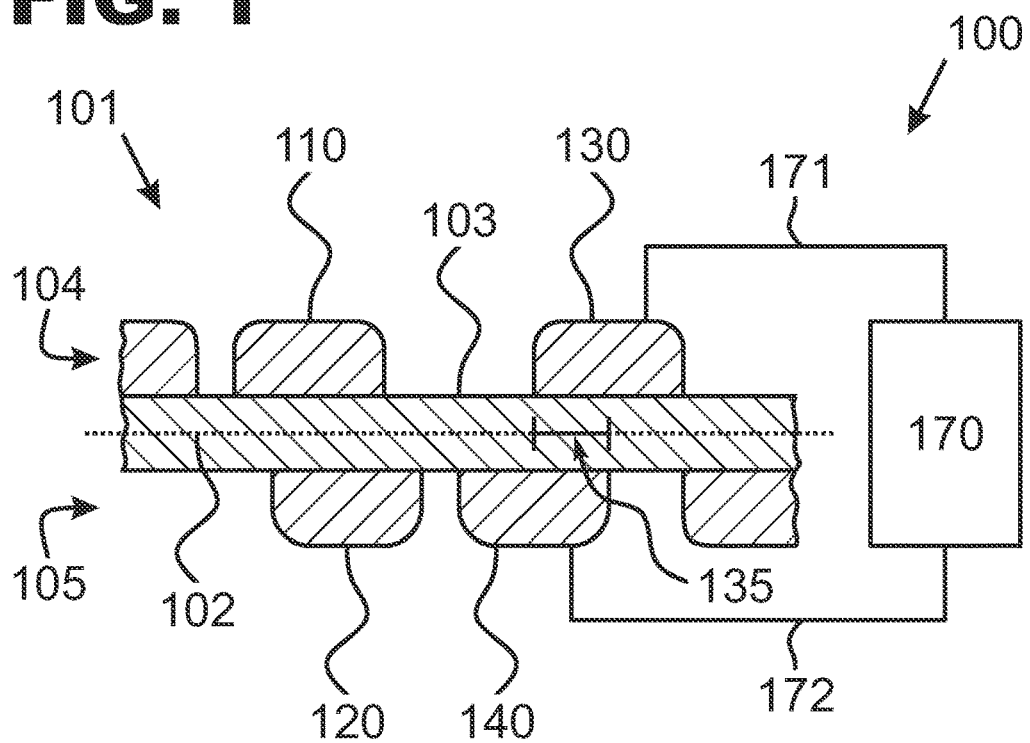
FIG. 1 depicts a partly cross-sectional, schematic illustration of a display arrangement.

FIG. 1 depicts a partly cross-sectional, schematic illustration of a display arrangement 100 according to an embodiment. Although not explicitly shown in FIG. 1, the embodiment of FIG. 1 or any part thereof may generally comprise any features and/or elements of any of the embodiments of FIGS. 2 to 6 which are omitted from FIG. 1.

In the embodiment of FIG. 1, the display arrangement 100 comprises a transparent thin film display element 101 with a layer structure extending substantially along a fictitious base plane 102 defining a lateral extension of the thin film display element 101.

Herein, a "layer" may refer to a generally sheet-formed element arranged on a surface or a body. Additionally or alternatively, a layer may refer to one of a series of superimposed, overlaid, or stacked generally sheet-formed elements. A layer may generally comprise a plurality of sublayers of different materials or material compositions. A layer may be path-connected. Some layers may be locally path-connected and disconnected.

In this disclosure, a base plane "defining a lateral extension" of an element with a layer structure may refer to said element comprising a layer and having lateral directions along said base plane, in which lateral directions said element may have dimensions substantially larger than in a thickness direction perpendicular to said lateral directions.

Herein, a "thin film" display element may refer to a display element having a total thickness less than or equal to 50 µm, or less than or equal to 20 µm, or less than or equal to 10 µm. Individual layers may have thicknesses, for example, in a range from a few nanometers to some hundreds of nanometers or some micrometers.

Throughout this specification, an element or material being "transparent", may refer to a quality, i.e., "transparency", of said element or material of allowing light of wavelength(s) within a range of relevant wavelengths to propagate through such element or material. Said range of relevant wavelengths may generally depend on intended usage of such transparent element or material.

Transparency of an element with a layer structure may refer to a capability of said element to transmit a main portion of irradiance of light within a range of relevant wavelengths incident on said element along an initial propagation direction intersecting a base plane of said element. A transparent element with a layer structure may transmit, for example, 50% or more, or 80% or more, of irradiance of light energy incident onto it at a range of relevant wavelengths. An element may transmit light and substantially maintain an initial propagation direction thereof. Such maintaining of initial propagation direction of light may refer to optical clarity of said element.

The base plane 102 of the embodiment of FIG. 1 is planar. In other embodiments, a thin film display element may be curved, extending substantially along a curved base plane. Further, although illustrated as a planar structure in FIG. 1, the thin film display element 101 may be formed as a rollable, flexible, and/or bendable structure. Consequently, a base plane may generally be variable.

In the embodiment of FIG. 1, the thin film display element 101 comprises an emissive layer 103. The emissive layer 103 is configured to emit light in consequence of electrical voltage coupled over the emissive layer 103.

In this specification, an "emissive layer" may refer to layer comprising material capable of emitting light when electrical voltage is coupled over said emissive layer.

The thin film display element 101 of the embodiment of FIG. 1 further comprises a first patterned conductor layer 104 on a first side of the emissive layer 103. Any thin film display element, such as the thin film display element 101 of the embodiment of FIG. 1, may generally be implemented as any suitable type of display element. As such, said any display element may generally comprise any number of suitable sublayers or additional layers.

Throughout this specification, a "conductor" may refer to an electrical conductor material and/or the electrical conductivity thereof. Consequently, a "conductor layer" may refer to a layer comprising a conductor material. Additionally or alternatively, a conductor layer may be electrically non-insulating, e.g., electrically conductive.

A conductor layer may comprise, for example, indium tin oxide (ITO), aluminum-doped zinc oxide (AZO, ZnO:Al), any other appropriate transparent conductive oxide (TCO), and/or any other transparent conductor material. Additionally or alternatively, a conductor layer may comprise, for example, a thin metal mesh. Such layers, with sufficiently low thicknesses, may be transparent.

Herein, a "patterned" layer may refer to a layer extending non-uniformly throughout an extent thereof. Additionally of alternatively, a patterned layer may refer to a structure comprising one or more discontinuities. Additionally or alternatively, a patterned layer may be locally path-connected and disconnected. Additionally or alternatively, a patterned layer may comprise a hole in a topological (homeomorphism) sense.

Such patterned nature of a layer may be implemented by several patterns, the patterns being separated from each other. In some embodiments, a patterned layer may be implemented with just one pattern. Then, the "patterned" nature of said layer may be implemented with the pattern not covering an underlying surface entirely, i.e., at least one opening or region exists in an area of said underlying surface which is not covered by said layer. Naturally, a "patterned conductor layer" may refer to a conductor layer with corresponding features.

Any appropriate patterning processes may generally be used to pattern a patterned conductor layer. Such patterning process may comprise several stages, such as cleaning, drying, photoresist coating, pre-baking, exposure, developing, etching, and/or stripping with cleaning/drying steps. For example, lithographic patterning for ITO as the material of a conductor layer may be carried out with an automated photolithography in-line tool utilizing wet-chemical processes. A selected etchant, which may be, for example, a mixture of hydrochloric acid (HCl) and nitric acid (HNO$_3$), removes the desired areas of the conductor layer.

The first patterned conductor layer 104 of the thin film display element 101 of the embodiment of FIG. 1 comprises a first display electrode 110.

Throughout this specification, a "display electrode" may refer to an electrode suitable for coupling electrical voltage over an emissive layer. A display electrode may be functionally, electrically, and/or galvanically connectable to any suitable display-powering means known in the art, e.g., a display driver unit, in order to supply said electrical voltage. Additionally or alternatively, a display electrode may at least partly, i.e., partly or entirely, laterally overlap another display electrode in order to enable coupling electrical voltage over an emissive layer.

In the embodiment of FIG. 1, the thin film display element 101 comprises a second patterned conductor layer 105 on a second side of the emissive layer 103. The second side is opposite the first side. The second patterned conductor layer 105 comprises a second display electrode 120. The second display electrode 120 partly overlaps the first display electrode 110. In other embodiments, a second display electrode may overlap a first display electrode at least partly. A second display electrode at least partly overlapping a first display electrode may enable coupling electrical voltage over an emissive layer.

In the embodiment of FIG. 1, the thin film display element 101 comprises two patterned conductor layers 104, 105. In other embodiments, a thin film display element may comprise at least one, e.g., two, or three, or more, patterned conductor layers on a first side of an emissive layer and at least one, e.g., two, or three, or more, patterned conductor layers on a second side of an emissive layer opposite the first side. In general, a thin film display element comprising a reduced number of conductor layers may exhibit improved transparency and/or optical clarity.

Although not illustrated in FIG. 1, a transparent thin film display element may generally be formed on any appropriate substrate or carrier. Said substrate may be formed, for example, of glass, e.g., sodalime, aluminosilicate, and/or any other appropriate transparent glass, or plastic. Suitable plastic materials include, for example, polyethylene (PE), polycarbonate (PC), and mixtures thereof, without being limited to these examples.

A substrate or carrier may mechanically protect a thin film display element and/or serve as an electrically insulating layer between said thin film display element and surroundings thereof. Further, there may also be another protective and/or insulating layer on an opposite side of said thin film display element. Such another layer may be formed by an external layer or element to which a display element is attached.

The thin film display element 101 of the embodiment of FIG. 1 further comprises a touch-sensing element and a control unit 170. The touch-sensing element comprises a first touch electrode 130 and a second touch electrode 140. The first touch electrode 130 is formed in the first patterned conductor layer 104, and the second touch electrode 140 is formed in the second patterned conductor layer 105. The control unit 170 is configured to measure touch-dependent capacitive coupling for at least one of the first touch electrode 130 and the second touch electrode 140, i.e., the first touch electrode 130 and/or the second touch electrode 140. Said measuring comprises supplying a time-dependent measurement voltage signal to the touch-sensing element. In other embodiments, a control unit may be configured to measure capacitive coupling for as many touch electrodes as suitable or necessary for any given application.

In this specification, a "control unit" may refer to a device, e.g., an electronic device, having at least one specified function related to determining and/or influencing an operational condition, status, or parameter related to another device, unit, or element. Said device, unit, or element may herein refer to at least part of a touch-sensing element of a thin film display element. A control unit may or may not form a part of a multifunctional control system.

A control unit being "configured to" perform a process may refer to capability of and suitability of said control unit for such process. This may be achieved in various ways. For example, a control unit may comprise at least one processor and at least one memory coupled to the at least one processor, the memory storing program code instructions which, when executed on said at least one processor, cause the processor to perform the process(es) at issue.

Additionally or alternatively, any functionally described features of a control unit may be performed, at least in part, by one or more hardware logic components. For example, and without limitation, illustrative types of suitable hardware logic components include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc. A control unit may generally be operated in accordance with any appropriate principles and by means of any appropriate circuitry and signals known in the art for capacitive touch sensing.

Herein, "touch-dependent capacitive coupling" may refer to capacitance as a physical quantity measurable for an element or between elements. Said capacitance may generally vary based on a material distribution in the surroundings of said element(s). Additionally or alternatively, touch-dependent capacitive coupling may refer to capacitance as an operational condition, status, or parameter indicative of or representing said physical quantity. In general, changes in capacitive coupling between at least part of an electrical circuit and a body extraneous to said circuit may affect an operational condition or status of said circuit. Such changes may be brought about by a touch, especially in case said electrical circuit comprises a touch-sensing element specifically configured for capacitive touch sensing. Consequently, changes in capacitive coupling may be associated with touch inputs, and a touch-based input arrangement may be devised based on detecting changes in capacitive coupling. Such an approach may generally be referred to as capacitive touch sensing.

Herein, a "touch" may refer to any change in distance between a pointing object, such as a finger, and a touch-sensing element resulting in a detectable change in coupling capacitance between said pointing object and said touch-sensing element. Additionally or alternatively, a touch may refer to any spatial arrangement of such pointing object and a touch-sensing element resulting in a detectable change in an operational condition, status, or parameter related to said touch-sensing element compared to a predefined standard condition, status, or parameter, respectively. As such, "touch sensing" may herein refer to touch and/or proximity sensing. Further, a "touch electrode" may refer to an electrode suitable for capacitive touch sensing, and/or a "touch-sensing element" may refer to at least part of a touch sensor for capacitive touch sensing.

In this specification, "supplying a time-dependent measurement voltage signal to an element" may refer to supplying said signal to at least part of said element. Specifically, in case of a touch-sensing element, said at least part may refer to at least one electrode of said touch-sensing element.

In the embodiment of FIG. 1, the control unit 170 is further configured, when supplying the measurement voltage signal to the touch-sensing element for measuring the touch-dependent capacitive coupling for one of the first touch electrode 130 and the second touch electrode 140, to supply a shielding voltage signal to the other touch electrode to decrease an effect of a touch from the side of said other touch electrode on the touch-dependent capacitive coupling for said one touch electrode. This may facilitate utilizing the display arrangement 100 in applications requiring or benefitting from directional touch sensitivity, even in the absence of any additional layers in the thin film display element 101.

Herein, a "shielding voltage signal" may refer to a signal, which may be time-dependent, suitable for decreasing an effect of a touch from a side of a touch electrode, when supplied to said touch electrode, on a touch-dependent capacitive coupling for another touch electrode. Additionally or alternatively, a shielding voltage signal may refer to a signal with a sufficient cross-correlation with a measurement voltage signal.

In practice, supply of measurement and shielding voltage signals by a control unit may be achieved using known electrical measurement circuitry and signals. Suitable circuitry may be commercially available. Suitable signal types may generally depend on a variety of factors, including thin film display element type, emissive layer structure, and economical considerations. In some embodiments, sinusoidal and/or square voltage signals may be used as measurement and/or shielding voltage signals. In the embodiment of FIG. 1, square voltage signals are used.

In the embodiment of FIG. 1, an electrical first touch connection 171 exists between the control unit 170 and the first touch electrode 130, and an electrical second touch connection 172 exists between the control unit 170 and the second touch electrode 140. Therefore, the control unit 170 controls the touch-sensing element of the thin film display element 101 directly. In other embodiments, a control unit may control a touch-sensing element of a thin film display element directly, or indirectly by controlling a separate intermediate controller, which in turn is electrically connected with said touch-sensing element and carries out actual touch-sensing element control operations.

The control unit 170 of the embodiment of FIG. 1 is specifically configured, when measuring touch-dependent capacitive coupling for said one of the first touch electrode 130 and the second touch electrode 140, to supply the measurement voltage signal to said one touch electrode, said touch-dependent capacitive coupling being indicative of a self-capacitance of said one touch electrode. Such features may generally enable forming a touch-sensitive display arrangement with directional sensitivity with a reduced number of electrodes and/or electrical interconnections.

Herein, "self-capacitance" of an element may refer to a physical quantity of a non-insulating body, e.g., an electrode, indicative of a ratio between added electrical charge in said body and an increase in electrical potential of said body. Measurement of self-capacitance may be referred to as measurement of capacitance with respect to infinity. In practice, measurement of self-capacitance may refer to measuring capacitance with respect to electrical ground, e.g., signal ground.

Additionally or alternatively, a control unit being configured to measure capacitive coupling "indicative of a self-capacitance" may refer to said control unit being operated in accordance with principles of self-capacitive touch technology.

The control unit 170 of the embodiment of FIG. 1 is specifically configured to measure touch-dependent capacitive coupling for only the first touch electrode 130. As such, in case of the embodiment of FIG. 1, said one touch electrode refers to the first touch electrode 130, and said other electrode refers to the second touch electrode 140. In other embodiments, a control unit may be configured to measure touch-dependent capacitive coupling for at least one of a first touch electrode and a second touch electrode, i.e., said first touch electrode and/or said second touch electrode. In said other embodiments, said touch-dependent capacitive coupling may or may not be indicative of self-capacitance(s).

As shown in FIG. 1, the first touch electrode 130 and the second touch electrode 140 partly laterally overlap each other in an overlapping region 135, indicated in FIG. 1 by a bar-terminated line segment. In other embodiments, a first touch electrode and a second touch electrode may or may not at least partly laterally overlap each other.

A first touch electrode and a second display electrode at least partly laterally overlapping each other may enhance insensitivity to touches from a side of one of said touch electrodes, when said one touch electrode is supplied with a shielding voltage signal.

In the embodiment of FIG. 1, a signal cross-correlation coefficient $c_s$ between the measurement voltage signal and the shielding voltage signal is at least 0.8, more specifically 0.99. In other embodiments, a signal cross-correlation coefficient may be less than 0.8, or at least 0.8, or at least 0.9, or at least 0.95.

Signal cross correlation may be considered a measure indicative of shape or phase similarity between two signals. For example, in case of sinusoidal signals, a cross-correlation coefficient $c_s$ corresponds to a cosine of a phase difference between said signals. A cross-correlation coefficient $c_s$ between two discrete-time signals $x[t]$ and $y[t]$ ($t=1 \ldots n$) may be definable as $$c_s = \frac{\sum_{i=1}^{n} \sum_{i=1}^{n} x[i] \ y[i]}{\sqrt{\sum_{j=1}^{n} x[j] \ x[j] \times \sum_{k=1}^{n} y[k] \ y[k]}}.$$

Under practical circumstances, many signals may be treatable as discrete-time signals. In case of continuous signals, a cross-correlation coefficient $c_s$ may be calculable by sampling said signals with a sufficiently high number of samples. Such cross-correlation coefficient $c_s$ may correspond, for example, to a limit value achieved when said number of samples increases without bound, or an approximation representative thereof.

A signal cross-correlation coefficient $c_s$ between a measurement voltage signal and a shielding voltage signal being at least 0.8, or at least 0.9, or at least 0.95 may significantly increase a direction-dependency of touch-sensitivity of a display arrangement.

In the embodiment of FIG. 1, an amplitude ratio between highest peak-to-peak amplitudes of the measurement voltage signal and the shielding voltage signal is in a range from 0.8 to 1.2. In other embodiments, any suitable amplitude ratios may be used. An amplitude ratio may be indicative of a voltage level similarity between two signals.

An amplitude ratio being in a range from 0.8 to 1.2, or in a range from 0.9 to 1.1, or from 0.95 to 1.05 may significantly increase a direction-dependency of touch-sensitivity of a display arrangement, especially in case of signals with similar shapes or phases.

Figure 2:
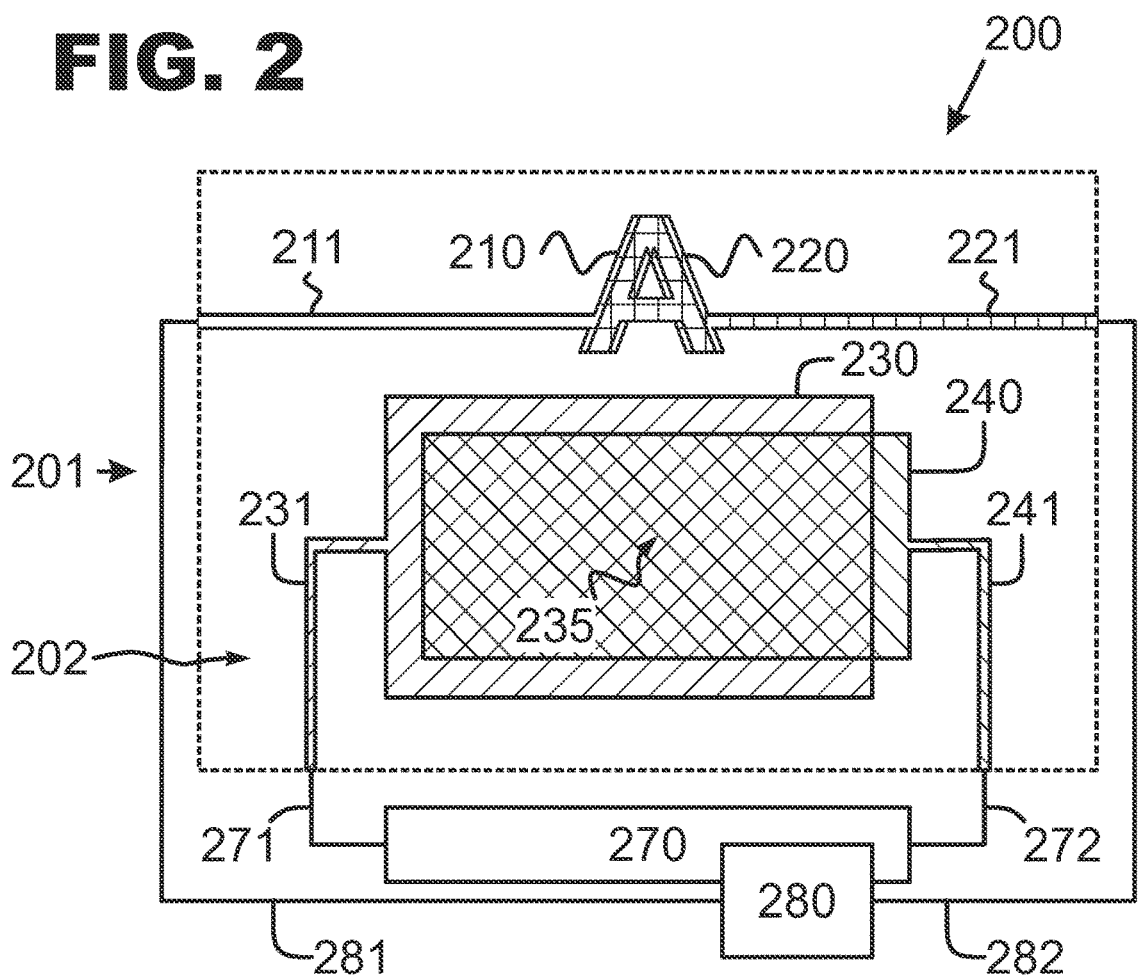
FIG. 2 shows a schematic illustration of a display arrangement.

FIG. 2 shows a partial view of a display arrangement 200 according to an embodiment from a viewing direction perpendicular to a base plane 202. Although not explicitly shown in FIG. 2, the embodiment of FIG. 2 or any part thereof may generally comprise any features and/or elements of any of the embodiments of FIGS. 1 and 3 to 6 which are omitted from FIG. 2.

In the embodiment of FIG. 2, the display arrangement 200 comprises a segment-type thin film display element 201 with a layer structure extending substantially along the base plane 202. The thin film display element 201 comprises a first patterned layer on a first side of an emissive layer, comprising a first display electrode 210, and a second patterned conductor layer, comprising a second display electrode 220 on another side of the emissive layer. In other embodiments, a display arrangement may comprise a segment-type and/or any other suitable type of thin film display element, such as a matrix-type thin film display element.

In this disclosure, a "segment-type" display element may refer to a display element in which emissive areas form individually or group-by-group controllable segments of letters, numbers, and/or other distinctive symbols. On the other hand, a "matrix-type" display element may refer to a display element in which conductor patterns of two patterned conductor layers define emissive parts of an emissive layer at locations where said conductor patterns overlap. Such emissive parts of a matrix-type display element may have, for example, rectangular or square shapes. In a matrix-type display, at least one conductor pattern may be involved in defining a plurality of (e.g., at least two) emissive parts.

The thin film display element 201 of the embodiment of FIG. 2 further comprises a first touch electrode 230 and a second touch electrode 240 in the first and second patterned conductor layers, respectively.

In the embodiment of FIG. 2, the display arrangement 200 of the embodiment of FIG. 2 comprises a control unit 270 configured to measure touch-dependent capacitive coupling for each of the first touch electrode 230 and the second touch electrode 240. The control unit 270 is depicted schematically in FIG. 2.

A control unit being configured to measure touch-dependent capacitive coupling for each of a first touch electrode and a second touch electrode may enable determining whether a touch originates from a side of the first or the second touch electrode.

The first touch electrode 230 of the embodiment of FIG. 2 comprises an elongated first touch electrode trace 231, and the second touch electrode 240 comprises an elongated second touch electrode trace 241. An electrical first touch connection 271 exists between the control unit 270 and the first touch electrode trace 231, and an electrical second touch connection 272 exists between the control unit 270 and the second touch electrode trace 241.

The control unit 270 of the embodiment of FIG. 2 is specifically configured, when measuring touch-dependent capacitive coupling for one of the first and second touch electrodes, to supply a measurement voltage signal to said one touch electrode, said touch-dependent capacitive coupling being indicative of a self-capacitance of said one touch electrode.

As shown in FIG. 2, the first touch electrode 230 and the second touch electrode 240 partly laterally overlap each other in an overlapping region 235, highlighted in FIG. 2 by diagonal cross-hatching. An overlapping ratio between an area of the overlapping region 235 and an area of a union of projections of the first touch electrode 230 and the second touch electrode 240 on the base plane 202 is at least 0.5, specifically about 0.7. In FIG. 2, the union of projections corresponds to the parts highlighted with any type of diagonal hatching, including diagonal cross-hatching. In other embodiments, overlapping ratios may be less than 0.5, at least 0.5, or at least 0.6, or at least 0.9.

Throughout this specification, a "projection" of an element onto a base plane may refer to a result of a function-like mapping of each point in said element onto said base plane. Said mapping may correspond to a process of associating with each domain point in said element a corresponding codomain point on said base plane, such that a line perpendicularly intersecting said base plane at said codomain point passes through said domain point. In case of multiple prospective codomain points, a prospective codomain point with a shortest Euclidean distance to said domain point may be selected as the codomain point. In case of a variable base plane, such mapping may be conducted with said base plane being in a position with a lowest average curvature. Furthermore, a "union of projections" may refer to a union of such projections in a mathematical (set theoretical) sense.

An overlapping ratio of at least 0.5, or at least 0.6, or at least 0.9 may yield significantly improved insensitivity to touches from a side of a touch electrodes supplied with a shielding voltage signal. Additionally or alternatively, insensitivity to such touches may be achievable with a reduced lateral footprint.

In the embodiment of FIG. 2, the display arrangement 200 further comprises a display driver unit 280, as illustrated schematically in FIG. 2. Additionally, the first display electrode 210 and the second display electrode 220 comprise an elongated first display electrode trace 211 and an elongated second display electrode trace 221, respectively. An electrical first display connection 281 exists between the display driver unit 280 and the first display electrode trace 211, and an electrical second display connection 282 exists between the display driver unit 280 and the second display electrode trace 221. The display driver unit 280 and the control unit 270 may or may not form sub-units of a single control system.

In other embodiments, a display arrangement may or may not comprise a display-powering means, e.g., a display driver unit. In some embodiments, a display-powering means may be implemented as a separate unit, whereas in others a display-powering means may be implemented as a sub-unit of a control system further comprising a control unit and/or any other suitable sub-units.

The thin film display element 201 of the embodiment of FIG. 2 is specifically implemented as an inorganic thin film electroluminescent (TFEL) display element. In other embodiments, a thin film display element may or may not be implemented as an inorganic thin film electroluminescent (TFEL) display element. A thin film display element may generally be implemented as any suitable type of display element.

Herein, an "inorganic thin film electroluminescent" type of display element may refer to a thin film display element comprising an emissive layer comprising an inorganic phosphor material layer. In inorganic TFEL displays, an alternating or pulsed driving voltage may be applied over such emissive layer. Peak-to-peak amplitudes of such driving voltages may be, for example, few hundreds of volts, generated by a specific display driver unit and fed to first and second display electrodes via conductors from output terminals of said display driver unit. In inorganic TFEL displays, a first insulating layer may be arranged between an emissive layer and a first patterned conductor layer, and a second insulating layer may be arranged between said emissive layer and a second patterned conductor layer.

Figure 3:
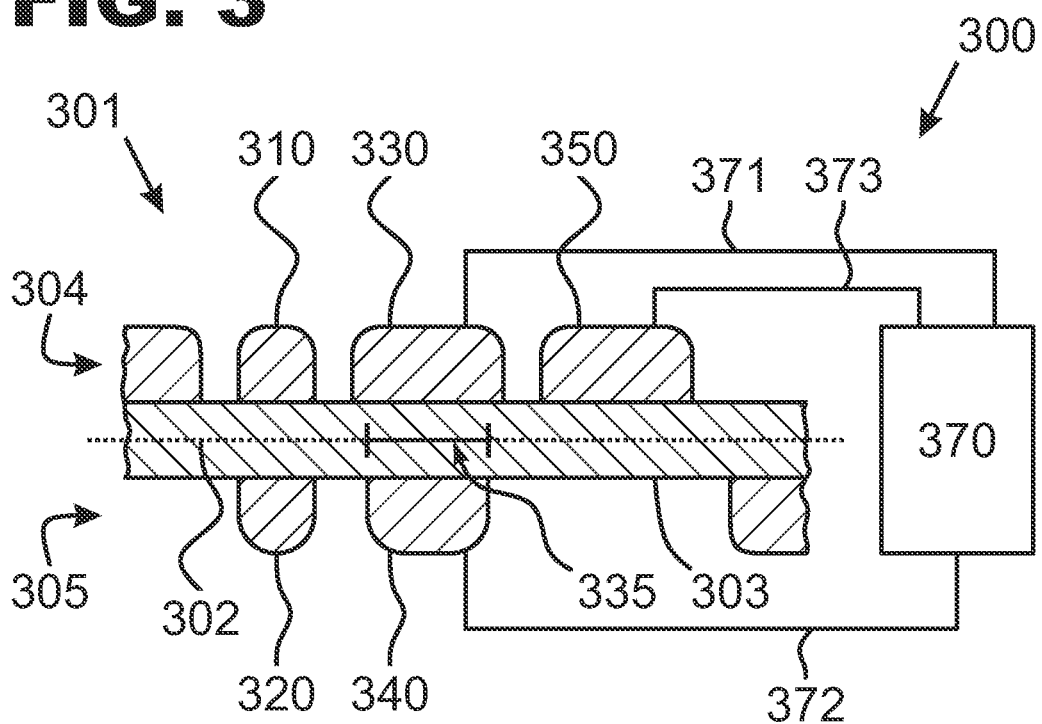
FIG. 3 depicts a partly cross-sectional, schematic illustration of a display arrangement.

FIG. 3 shows a partly cross-sectional, schematic illustration of a display arrangement 300 according to an embodiment. Although not explicitly shown in FIG. 3, the embodiment of FIG. 3 or any part thereof may generally comprise any features and/or elements of any of the embodiments of FIGS. 1, 2 and 4 to 6 which are omitted from FIG. 3.

The display arrangement 300 of the embodiment of FIG. 3 comprises a thin film display element 301 extending substantially along a fictitious base plane 302. The thin film display element 301 comprises a first display electrode 310 formed in a first patterned conductor layer 304 as well as a second display electrode 320 formed in a second patterned conductor layer 305. An emissive layer 303 extends between the two patterned conductor layers. The thin film display element 301 further comprises a first touch electrode 330 and a second touch electrode 340 formed in the first 304 and second 305 patterned conductor layers, respectively.

In the embodiment of FIG. 3, a control unit 370, which is schematically shown in FIG. 3, is configured to measure touch-dependent capacitive coupling for at least one of the first touch electrode 330 and the second touch electrode 340 and, when measuring the touch-dependent capacitive coupling for one of the first touch electrode 330 and the second touch electrode 340, to feed a shielding voltage signal to the other touch electrode to decrease an effect of a touch from the side of said other touch electrode on the touch-dependent capacitive coupling for said one touch electrode. In other words, either one of the touch electrodes 330, 340 of the embodiment of FIG. 3 may receive a shielding voltage signal when capacitive coupling is measured for the other electrode.

The touch-sensing element also comprises a transmitter electrode 350 in the first patterned conductor layer 304, and the control unit 370 is configured, when measuring touch-dependent capacitive coupling for said one touch electrode, to supply a measurement voltage signal to the transmitter electrode 350, said touch-dependent capacitive coupling being indicative of a mutual capacitance between the transmitter electrode 350 and said one touch electrode. Such features may generally facilitate achieving higher directional sensitivity, especially in case of distant pointing object(s).

In other embodiments, a touch-sensing element may or may not comprise a transmitter electrode in a first and/or a second patterned conductor layer. In some embodiments, a touch-sensing element may comprise a transmitter electrode having a first part extending in a first patterned layer, a second part extending in a second patterned conductor layer, and a connecting part connecting said first and second parts. In some embodiments, a touch-sensing element may comprise a plurality of transmitter electrodes. Generally, a transmitter electrode extending in only one patterned conductor layer may be sufficient under practical circumstances, especially in case of a display element having a total thickness less than or equal to 50 μm, or less than or equal to 20 μm, or less than or equal to 10 μm.

In this specification, "mutual capacitance" may refer to capacitance occurring between two electrically chargeable bodies. Additionally or alternatively, a control unit being configured to measure capacitive coupling "indicative of a mutual capacitance" may refer to said control unit being operated in accordance with principles of projected capacitive (PCAP) touch technology. In PCAP touch technology, touch is detected on the basis of a change of a coupling capacitance between two touch electrodes, caused by the introduction and/or removal of dielectric and possibly lossy media of a touching member, e.g., a human finger, sufficiently close to said touch electrodes.

In the embodiment of FIG. 3, an electrical first touch connection 371 exists between the control unit 370 and the first touch electrode 330, an electrical second touch connection 372 exists between the control unit 370 and the second touch electrode 340, and an electrical transmitter connection 373 exists between the control unit 370 and the transmitter electrode 350. Therefore, the control unit 370 controls the touch-sensing element of the thin film display element 101 directly. In other embodiments, a control unit may control a touch-sensing element of a thin film display element directly or indirectly.

In the embodiment of FIG. 3, the first touch electrode 330 and the second touch electrode 340 laterally overlap each other in an overlapping region 335, and an overlapping ratio between an area of the overlapping region 335 and an area of a union of projections of the first touch electrode 330 and the second touch electrode 340 on the base plane 302 is 0.8. In other embodiments, overlapping ratios may be less than 0.5, at least 0.5, or at least 0.6, or at least 0.9.

The thin film display element 301 of the embodiment of FIG. 3 is specifically implemented as a thin film organic light emitting diode (OLED) display element, a particular type of TFEL display element. In other embodiments, a thin film display element may or may not be implemented as an OLED display element.

An emissive layer of an OLED display element may generally comprise organic light-emitting molecules and/or polymers. Additionally, an OLED display element may comprise a number of auxiliary layers between such an emissive layer and a patterned conductor layer in order to improve an efficiency of said display element. Such auxiliary layers may include electron/hole blocking, electron/hole transport, and/or electron/hole injection layers. In some embodiments, OLED display elements with different auxiliary layers may be used.

Figure 4:
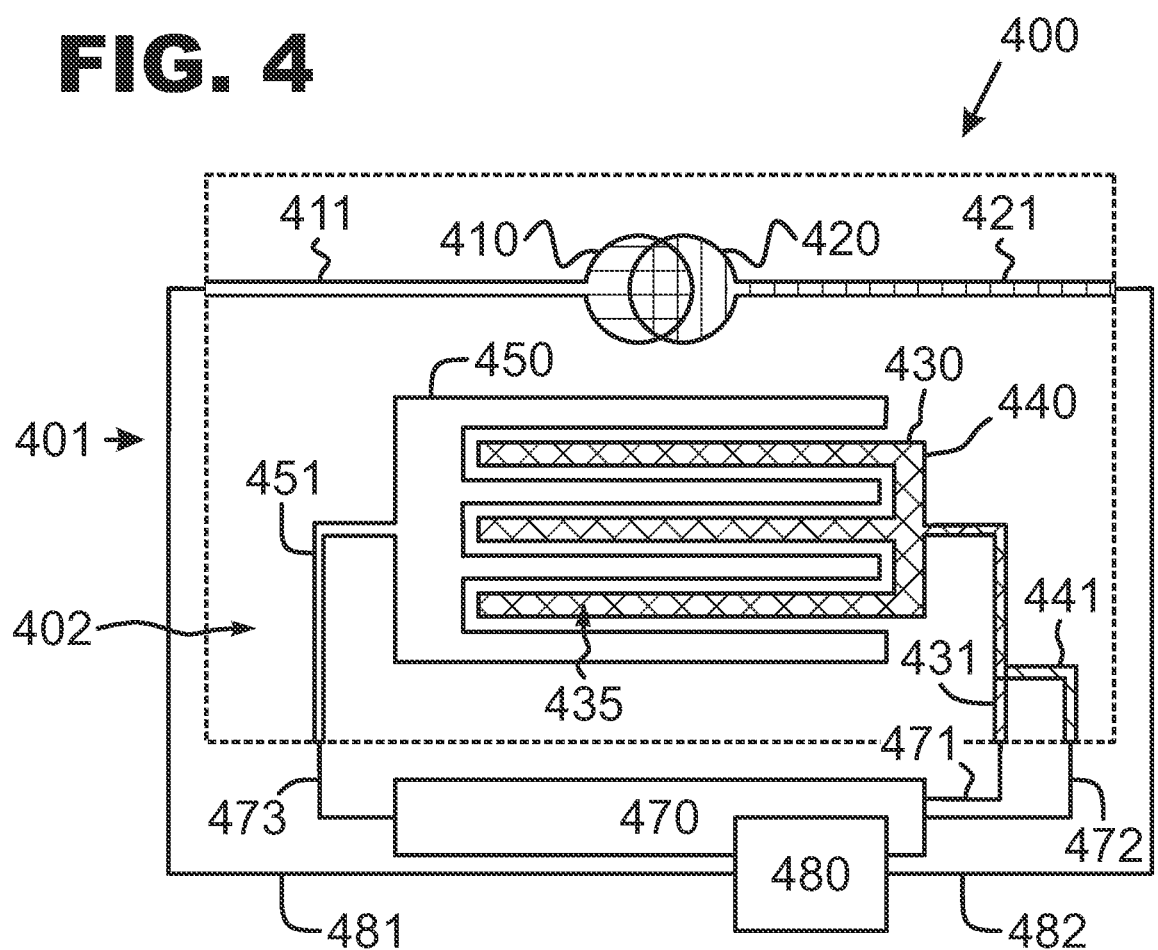
FIG. 4 shows a schematic illustration of a display arrangement.

FIG. 4 depicts a partial view of a display arrangement 400 according to an embodiment from a viewing direction perpendicular to a base plane 402. Although not explicitly shown in FIG. 4, the embodiment of FIG. 4 or any part thereof may generally comprise any features and/or elements of any of the embodiments of FIGS. 1 to 3, 5, and 6 which are omitted from FIG. 4.

In particular, the display arrangement 400 of the embodiment of FIG. 4 may be similar to that of the embodiment of FIG. 3, comprising a thin film display element 401, having first and second patterned conductor layers on opposite sides of an emissive layer; a first display electrode 410 and a second display electrode 420 extending in their respective patterned conductor layers; a touch-sensing element comprising a first touch electrode 430 and a second touch electrode 440 extending in their respective patterned conductor layers, as well as a transmitter electrode 450 in the first and/or the second patterned conductor layer; and a control unit 470 configured, when measuring touch-dependent capacitive coupling for one of the first touch electrode 430 and the second touch electrode 440, to supply a measurement voltage signal to the transmitter electrode 450, said touch-dependent capacitive coupling being indicative of a mutual capacitance between the transmitter electrode 450 and said one touch electrode.

However, in the embodiment of FIG. 4, the first touch electrode 430 and the second touch electrode 440 almost completely laterally overlap each other in an overlapping region 435, i.e., the embodiment of FIG. 4 has an overlapping ratio of about 1.

Moreover, the first touch electrode 430 of the embodiment of FIG. 4 comprises an elongated first touch electrode trace 431, the second touch electrode 440 comprises an elongated second touch electrode trace 441, and the transmitter electrode 450 comprises an elongated transmitter electrode trace 451. An electrical first touch connection 471 exists between the control unit 470 and the first touch electrode trace 431, an electrical second touch connection 472 exists between the control unit 470 and the second touch electrode trace 441, and an electrical transmitter connection 473 exists between the control unit 470 and the transmitter electrode trace 441.

Further, the first touch electrode 430, the second touch electrode 440, and the transmitter electrode 450 are formed as interdigitated electrodes. In other embodiments, touch and transmitter electrodes may or may not be formed as interdigitated electrodes. Forming touch and transmitter electrodes as interdigitated electrodes may generally improve a touch sensitivity of a display arrangement.

Finally, the display arrangement 400 further comprises a display driver unit 480, illustrated schematically in FIG. 4. Additionally, the first display electrode 410 and the second display electrode 420 comprise an elongated first display electrode trace 411 and an elongated second display electrode trace 421, respectively. An electrical first display connection 481 exists between the display driver unit 480 and the first display electrode trace 411, and an electrical second display connection 482 exists between the display driver unit 480 and the second display electrode trace 421.

Figure 5:
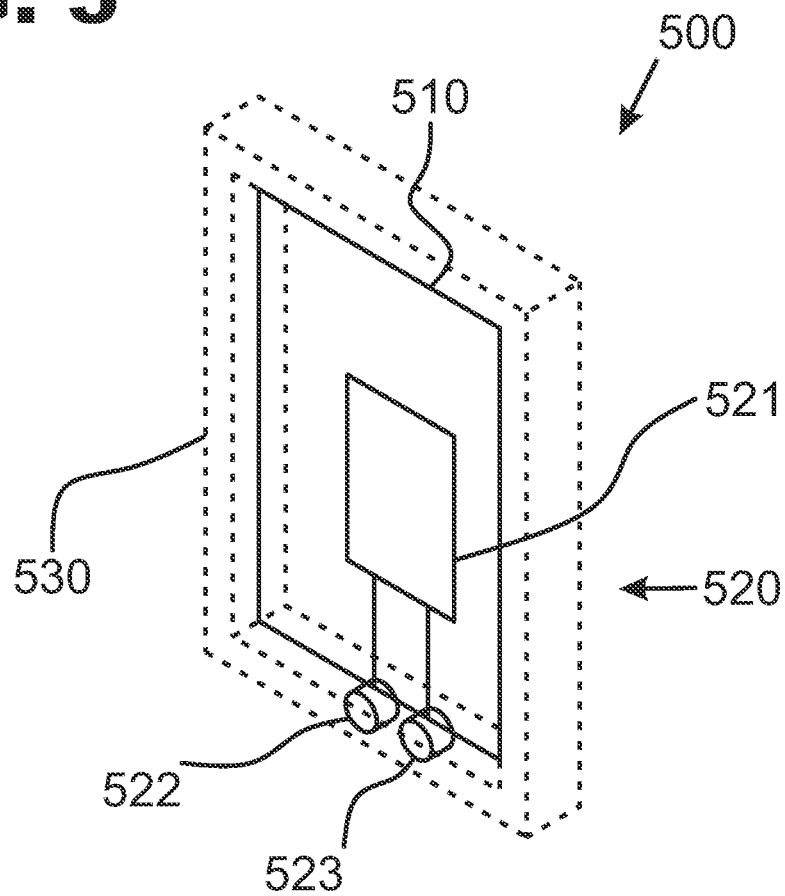
FIG. 5 depicts a double-sided display panel.
Figure 6:
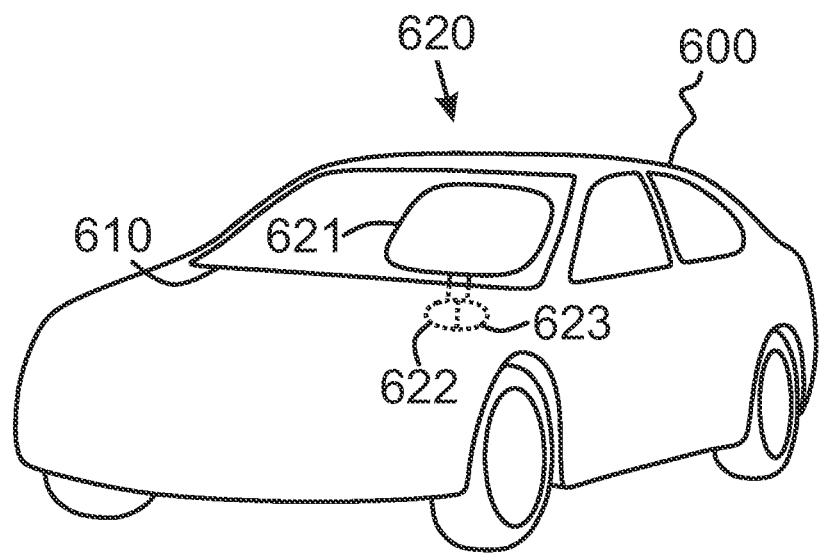
FIG. 6 shows a car, one particular type of vehicle, comprising a window assembly configured as a windscreen.

FIGS. 5 and 6 illustrate exemplary products comprising display arrangements 520, 620, which may be in accordance with any of the embodiments disclosed with reference to, in conjunction with, and/or concomitantly with any of FIGS. 1 to 4. Additionally or alternatively, although not explicitly shown in any of FIGS. 5 to 7, the embodiment of either of FIGS. 5 and 6 or any part thereof may generally comprise any features and/or elements of any of the embodiments of FIGS. 1 to 4 which are omitted from a drawing depicting said embodiment.

FIG. 5 depicts a double-sided display panel 500 according to an embodiment. The double-sided display panel 500 comprises a transparent screen 510 and a display arrangement 520. The display arrangement 520 comprises a thin film display element 521, a control unit 522, and a display driver unit 523, one particular type of display-powering means.

Herein, a "double-sided" display panel may refer to a display panel comprising a display element with at least one emissive area for emitting light therefrom at least to two opposite directions in order to present visual information at least to two mutually opposite sides of said display panel. A double-sided display panel may generally be transparent.

The thin film display element 521 of the embodiment of FIG. 5 is laminated on the screen 510. In other embodiments, a thin film display element may be laminated or otherwise coupled to a screen. In some embodiments, a screen may have a layer structure with a first and a second layer, and a thin film display element may be arranged between said first and second layers.

A double-sided display panel may generally further comprise a frame 530, as indicated in FIG. 5 by dashed lines. In embodiments comprising a frame, a control unit and/or a display-powering means may be arranged at least in part inside said frame.

In some embodiments, a double-sided display panel may correspond to a window assembly. Throughout this specification, a "window assembly" may refer to a unit comprising a screen and a display arrangement coupled together and configured to be mountable to a wall or a roof of a building or a vehicle for covering an opening therein.

FIG. 6 shows a car 600, one particular type of vehicle, according to an embodiment. The car 600 comprises a window assembly 610 comprising a display arrangement 620 with a thin film display element 621, a control unit 622, and a display driver unit 623. In other embodiments, a vehicle may or may not correspond to a car. A "vehicle" may herein refer to any machine configured to transport people or cargo. Consequently, the term "vehicle" may refer, for example, to a car, a bicycle, a motorcycle, a train, a ship, an airplane, a helicopter, a spacecraft, or any variation or hybrid thereof, without limiting the scope of the term to these specific examples.

The window assembly 610 of the embodiment of FIG. 6 is configured to function as a windscreen of the car 600. In other embodiments, a window assembly may be configured to function as a windscreen or any other type of window.

In the embodiment of FIG. 6, the window assembly 610 comprises a first curved sheet of safety glass and a second curved sheet of safety glass laminated together using a plastic layer, and the thin film display element 621 is arranged between the first and second curved sheets of safety glass. In other embodiments, a window assembly may have a structure identical, similar, or different to the window assembly 610 of the embodiment of FIG. 6.

Above, mainly structural and material aspects of display arrangements and products comprising display arrangements are discussed. In the following, more emphasis will lie on method aspects related to touch detection. What is said above about the ways of implementation, definitions, details, and advantages related to the structural and material aspects applies, mutatis mutandis, to the method aspects discussed below. The same applies vice versa.

Figure 7:
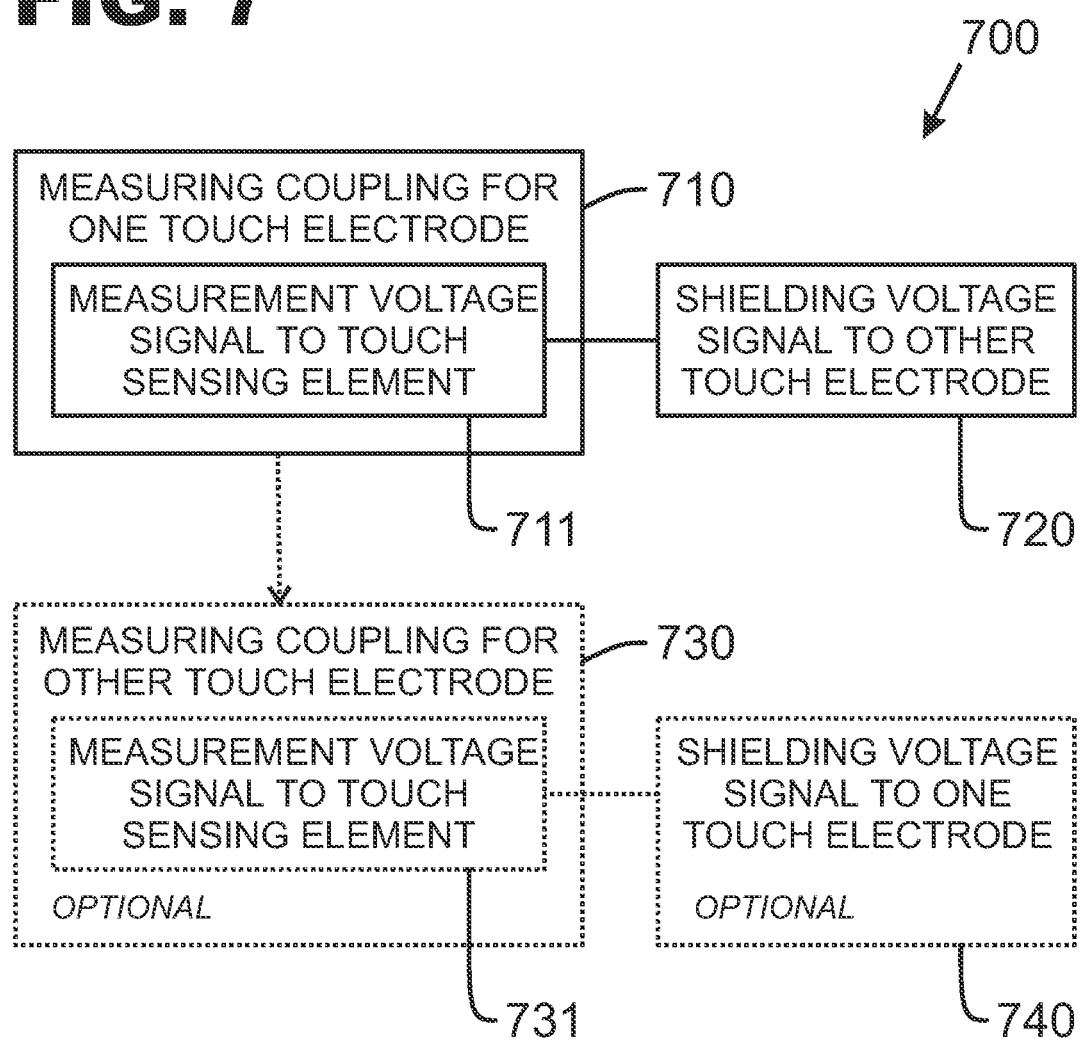
FIG. 7 illustrates a method for touch detection using a thin film display element.

FIG. 7 illustrates a method 700 for touch detection using a thin film display element, which may be in accordance with any of the embodiments disclosed with reference to, in conjunction with, and/or concomitantly with any of FIGS. 1 to 6.

The method 700 of the embodiment of FIG. 7 comprises the compulsory (i.e., non-optional) processes of measuring touch-dependent capacitive coupling 710 for one of a first touch electrode and a second touch electrode of a touch-sensing element of the thin film display element, said measuring comprising supplying a time-dependent measurement voltage signal 711 to the touch-sensing element, and, when supplying the measurement voltage signal to the touch-sensing element for measuring the touch-dependent capacitive coupling for said one of the first and the second touch electrodes, supplying a shielding voltage signal 720 to the other touch electrode to decrease an effect of a touch from the side of said other touch electrode on the touch-dependent capacitive coupling for said one touch electrode.

In the embodiment of FIG. 7, the method 700 further comprises the optional processes of measuring touch-dependent capacitive coupling 730 for said other touch electrode, said measuring comprising supplying a time-dependent measurement voltage signal 731 to the touch-sensing element, and, when supplying the measurement voltage signal to the touch-sensing element for measuring the touch-dependent capacitive coupling for said other touch electrode, supplying a shielding voltage signal 740 to said one touch electrode to decrease an effect of a touch from the side of said one touch electrode on the touch-dependent capacitive coupling for said other touch electrode.

Consequently, the method 700 of the embodiment of FIG. 7 constitutes an example of a method for touch detection using a thin film display element comprising measuring touch-dependent capacitive coupling for each of a first touch electrode and a second touch electrode of a touch-sensing element of the thin film display element.

In an embodiment, a method for touch detection using a thin film display element comprises steps implementing processes corresponding to the processes 710, 711, 720, 730, 731, 740 of the method 700 of the embodiment of FIG. 7. In other embodiments, a method for touch detection using a thin film display element may comprise steps implementing processes corresponding to the compulsory processes 710, 711, 720 of the method 700 of the embodiment of FIG. 7.

Generally, steps of a method for touch detection using a thin film display element implementing processes corresponding to any of the processes 710, 711, 720, 730, 731, 740 of the method 700 of the embodiment of FIG. 7 need not be executed in any fixed order. Furthermore, a method for touch detection using a thin film display element may generally comprise any number of additional processes, steps, and/or features that are not disclosed herein in connection to the method 700 of the embodiment of FIG. 7.

For example, in an embodiment, each touch-dependent capacitive coupling is indicative of a self-capacitance of a touch electrode. In another embodiment, a touch-sensing element comprises a transmitter electrode in a first and/or a second patterned conductor layer and each touch-dependent capacitive coupling is indicative of a mutual capacitance between the transmitter electrode and a touch electrode.

Irrespective of the means used for carrying out a method for touch detection using a thin film display element, any steps of the method may be performed at least partially automatically by means of suitable computing and/or data-processing means. Such means may comprise, for example, at least one processor and at least one memory coupled to the processor. The at least one memory may store program code instructions which, when run on the at least one processor, cause the processor to perform steps implementing various processes of the method. Additionally or alternatively, at least some of those steps may be carried out, at least partially, by means of some hardware logic elements or components, such as Application-specific Integrated Circuits (ASICs), Application-specific Standard Products (ASSPs), or System-on-a-chip systems (SOCs), without being limited to these specific examples.

It is obvious to a person skilled in the art that with the advancement of technology, the basic idea of the invention may be implemented in various ways. The invention and its embodiments are thus not limited to the examples described above, instead they may vary within the scope of the claims.

It will be understood that any benefits and advantages described above may relate to one embodiment or may relate to several embodiments. The embodiments are not limited to those that solve any or all of the stated problems or those that have any or all of the stated benefits and advantages.

The term "comprising" is used in this specification to mean including the feature(s) or act(s) followed thereafter, without excluding the presence of one or more additional features or acts. It will further be understood that reference to 'an' item refers to one or more of those items.

The invention claimed is:

1. A display arrangement comprising a transparent thin film display element with a layer structure extending substantially along a base plane defining a lateral extension of the display element, the thin film display element comprising:
   an emissive layer configured to emit light in consequence of electrical voltage coupled over the emissive layer;
   a first patterned conductor layer, on a first side of the emissive layer, comprising a first display electrode;
   a second patterned conductor layer, on a second side of the emissive layer opposite the first side, comprising a second display electrode at least partly laterally overlapping the first display electrode; and
   a touch-sensing element comprising a first touch electrode and a second touch electrode formed in the first and second patterned conductor layers, respectively,
   wherein the display arrangement further comprises a control unit configured to measure touch-dependent capacitive coupling for at least one of the first and second touch electrodes, said measuring comprising supplying a time-dependent measurement voltage signal to the touch-sensing element, and, when supplying the measurement voltage signal to the touch-sensing element for measuring the touch-dependent capacitive coupling for one of the first and second touch electrodes, to supply a shielding voltage signal to the other touch electrode to decrease an effect of a touch from the side of said other touch electrode on the touch-dependent capacitive coupling for said one touch electrode,
   wherein a signal cross-correlation coefficient $c_s$ between the measurement voltage signal and the shielding voltage signal is at least 0.8.

2. A display arrangement according to claim 1, wherein the control unit is configured to measure touch-dependent capacitive coupling for each of the first and second touch electrodes.

3. A display arrangement according to claim 1, wherein the control unit is configured, when measuring touch-dependent capacitive coupling for said one of the first and second touch electrodes, to supply the measurement voltage signal to said one touch electrode, said touch-dependent capacitive coupling being indicative of a self-capacitance of said one touch electrode.

4. A display arrangement according to claim 1, wherein the touch-sensing element comprises a transmitter electrode in the first and/or the second patterned conductor layer and the control unit is configured, when measuring touch-dependent capacitive coupling for said one of the first and second touch electrodes, to supply the measurement voltage signal to the transmitter electrode, said touch-dependent capacitive coupling being indicative of a mutual capacitance between the transmitter electrode and said one touch electrode.

5. A display arrangement according to claim 1, wherein the first and second touch electrodes at least partly laterally overlap each other.

6. A display arrangement according to claim 5, wherein the first and second touch electrodes laterally overlap each other in an overlapping region and an overlapping ratio between an area of the overlapping region and an area of a union of projections of the first and second touch electrodes on the base plane is at least 0.5.

7. A display arrangement according to claim 1, wherein an amplitude ratio between highest peak-to-peak amplitudes of the measurement voltage signal and the shielding voltage signal is in a range from 0.8 to 1.2.

8. A display arrangement according to claim 1, wherein the thin film display element is implemented as a segment-type display element.

9. A display arrangement according to claim 1, wherein the thin film display element is implemented as an inorganic thin film electroluminescent, TFEL, display element.

10. A display arrangement according to claim 1, wherein the thin film display element is implemented as a thin film organic light emitting diode, OLED, display element.

11. A double-sided display panel comprising a display arrangement according to claim 1.

12. A window assembly comprising a display arrangement according to claim 1.

13. A method for touch detection using a thin film display element in accordance with claim 1, the method comprising:
measuring touch-dependent capacitive coupling for at least one of the first and the second touch electrodes, said measuring comprising supplying a time-dependent measurement voltage signal to the touch-sensing element; and
when supplying the measurement voltage signal to the touch-sensing element for measuring the touch-dependent capacitive coupling for one of the first and the second touch electrodes, supplying a shielding voltage signal to the other touch electrode to decrease an effect of a touch from the side of said other touch electrode on the touch-dependent capacitive coupling for said one touch electrode.

14. A method according to claim 13, comprising measuring touch-dependent capacitive coupling for each of the first and second touch electrodes.

15. A method according to claim 13, wherein each touch-dependent capacitive coupling is indicative of a self-capacitance of a touch electrode.

16. A method according to claim 13, wherein the touch-sensing element comprises a transmitter electrode in the first and/or the second patterned conductor layer and each touch-dependent capacitive coupling is indicative of a mutual capacitance between the transmitter electrode and a touch electrode.

17. A vehicle comprising a window assembly, the window assembly comprising a display arrangement, the display arrangement comprising a transparent thin film display element with a layer structure extending substantially along a base plane defining a lateral extension of the display element, the thin film display element comprising:
an emissive layer configured to emit light in consequence of electrical voltage coupled over the emissive layer;
a first patterned conductor layer, on a first side of the emissive layer, comprising a first display electrode;
a second patterned conductor layer, on a second side of the emissive layer opposite the first side, comprising a second display electrode at least partly laterally overlapping the first display electrode; and
a touch-sensing element comprising a first touch electrode and a second touch electrode formed in the first and second patterned conductor layers, respectively,
wherein the display arrangement further comprises a control unit configured to measure touch-dependent capacitive coupling for at least one of the first and second touch electrodes, said measuring comprising supplying a time-dependent measurement voltage signal to the touch-sensing element, and, when supplying the measurement voltage signal to the touch-sensing element for measuring the touch-dependent capacitive coupling for one of the first and second touch electrodes, to supply a shielding voltage signal to the other touch electrode to decrease an effect of a touch from the side of said other touch electrode on the touch-dependent capacitive coupling for said one touch electrode.

* * * * *